United States Patent
Wolber

(10) Patent No.: US 6,772,691 B2
(45) Date of Patent: Aug. 10, 2004

(54) SYSTEM AND METHOD FOR REGISTERING MEDIA IN AN IMAGING SYSTEM

(75) Inventor: John W. Wolber, Nashua, NH (US)

(73) Assignee: Agfa Corporation, Wilmington, MA (US)

(*) Notice: Subject to any disclaimer, the term of this patent is extended or adjusted under 35 U.S.C. 154(b) by 0 days.

(21) Appl. No.: 10/230,557

(22) Filed: Aug. 29, 2002

(65) Prior Publication Data

US 2004/0040456 A1 Mar. 4, 2004

(51) Int. Cl.[7] .................................................. B41F 27/00
(52) U.S. Cl. .............. 101/486; 101/463.1; 101/DIG. 36
(58) Field of Search ............................ 101/463.1, 465, 101/466, 467, 401.1, 485, 486, DIG. 36; 347/262, 264; 29/33 H; 72/37

(56) References Cited

U.S. PATENT DOCUMENTS

| 5,255,607 A | * 10/1993 | Nishiyama et al. ....... 101/463.1 |
| 5,257,444 A | * 11/1993 | Nishiyama ................. 29/33 H |
| 5,502,993 A | * 4/1996 | Powers et al. ................. 72/37 |
| 5,826,513 A | * 10/1998 | Fromson et al. ......... 101/463.1 |
| 5,987,949 A | * 11/1999 | Palmatier et al. ............. 72/17.3 |
| 6,076,464 A | * 6/2000 | Okamura ................. 101/401.1 |
| 6,233,038 B1 | * 5/2001 | Lennhoff et al. .............. 355/47 |
| 6,264,593 B1 | * 7/2001 | Newton et al. .............. 493/324 |
| 6,300,971 B1 | * 10/2001 | Masotta et al. ............. 347/264 |
| 6,318,262 B1 | 11/2001 | Wolber et al. |
| 6,354,208 B1 | * 3/2002 | Bos et al. ................. 101/463.1 |

FOREIGN PATENT DOCUMENTS

| EP | 0320014 | 6/1989 |
| EP | 0326137 | 8/1989 |
| EP | 0882581 | 12/1998 |
| GB | 2059627 | * 4/1981 |

* cited by examiner

Primary Examiner—Stephen R. Funk
(74) Attorney, Agent, or Firm—William E. Hilton; Robert A. Sabourin

(57) ABSTRACT

An imaging system is disclosed for imaging and registering recordable media. The imaging system includes an input opening through which recordable media may be input to the imaging system, an imaging unit, a registration unit and an output opening through which registered imaged media may exit the imaging system. The imaging unit is for imaging the recordable media that is received through the input opening, and provides imaged media. The registration unit is for receiving imaged media from the imaging unit, and for registering the imaged media by creating registration features in the imaged media. The registration unit provides registered imaged media.

8 Claims, 5 Drawing Sheets

SYSTEM AND METHOD FOR REGISTERING MEDIA IN AN IMAGING SYSTEM

BACKGROUND OF THE INVENTION

The invention generally relates to the field of imaging systems, and specifically relates to systems and methods for registering plates such as lithographic or flexographic plates in a platemaking system.

In many pre-press imaging systems, such as imagesetters or platesetters, a plurality of sheets or plates (hereafter referred to as plates) of recording media are separately exposed by an imaging source. Each plate may provide a pattern for a different color (e.g., yellow, magenta, cyan and possibly black), and these plates must be registered with one another during printing of the final multi-color image. The recording media to be imaged by a pre-press imaging system is commonly supplied in web form or in discrete plates. The recording media may include photosensitive material, radiation sensitive material, thermally sensitive material, or any other type of imageable material.

Registration of the plates is typically performed by punching or creating notches or holes or other features that may be used to register plates (hereafter referred to as registration features) in the recording media at specific registration locations. These registration features must be accurately and consistently applied to the plates, and the features are typically applied either while the recording media is in contact with a media support surface during imaging, or after imaging at a separate punch press station.

During imaging, a movable optical carriage is typically used to displace a laser system or other imaging source in a slow scan direction along a stationary or moving, curved or planar, media support surface (e.g., an external drum, and internal drum, a flatbed, or other support surface). The imaging source exposes a supply of recording media supported on, and held against, the media support surface. Generally, the imaging source includes an optical system for scanning one or more lasers or other radiation beams, each modulated by a digital information signal, over the recording media to record an image onto the recording media. Generally, the information signal is recorded onto a supply of recording media mounted about the external drum by displacing the imaging source relative to the media support surface, e.g., an external drum. This may be accomplished in a number of ways, including rotation of the external drum in combination with a lateral translation of the imaging source, etc. In certain systems, the external drum is rotated while the imaging source is displaced in discrete steps or continuously along the length of the external drum to record data onto the recording media.

Although the media may be accurately positioned when being imaged and punched while the media is on the media support surface, the presence of the punch apparatus in the imaging area may present mechanical difficulties. For example, plates may bind or become misaligned during loading into the image area as they pass through a punch opening, particularly if the leading edge of the plate is curled for any reason. Although increasing the size of the punch opening may alleviate the problem, this may increase the risk of mechanical error if the punch assembly requires too much mechanical movement. It is generally desirable to minimize the amount of mechanical movement of a punch assembly.

The use of a separate punch press station, on the other hand, requires additional floor space as well as separate processing steps, which increase the risk of occurrence of human and other errors. Moreover, plates are typically punched after chemical processing of the plates since they must be handled during transport to the punch press station.

There is a need, therefore, for an improved system and method for registering plates in a pre-press imaging system.

SUMMARY OF THE INVENTION

The invention provides an imaging system for imaging and registering recordable media. The imaging system includes an input opening through which recordable media may be input to the imaging system, an imaging unit, a registration unit and an output opening through which registered imaged media may exit the imaging system. The imaging unit is for imaging the recordable media that is received through the input opening, and provides imaged media. The registration unit is for receiving imaged media from the imaging unit, and for registering the imaged media by creating registration features in the imaged media. The registration unit provides registered imaged media.

BRIEF DESCRIPTION OF THE DRAWINGS

The following description may be further understood with reference to the accompanying drawings in which.

DETAILED DESCRIPTION OF THE ILLUSTRATED EMBODIMENTS

Figure 1:
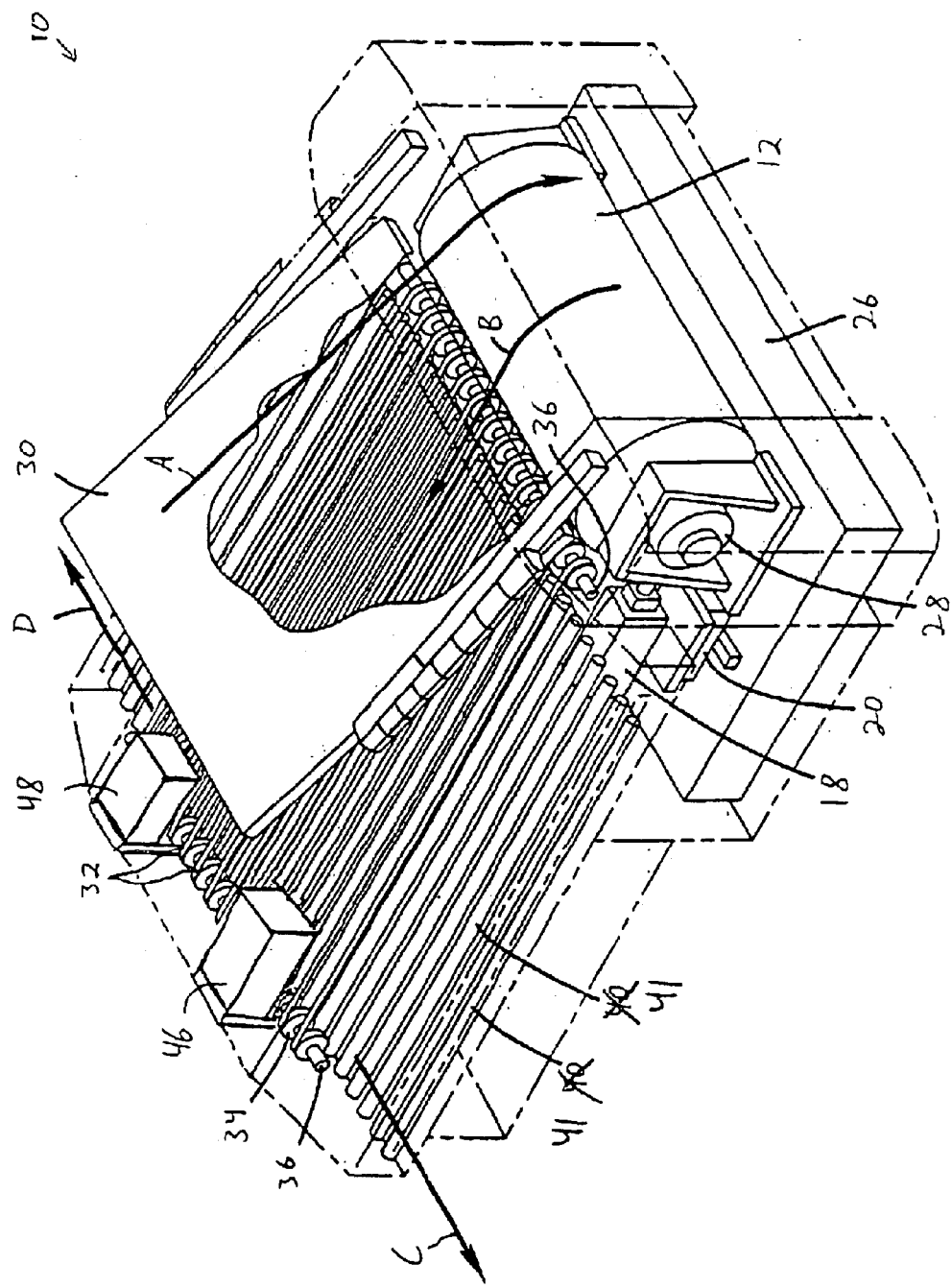
FIG. 1 shows an illustrative isometric view of an external drum imaging system incorporating a registration system in accordance with an embodiment of the invention with the housing removed.

An embodiment of a system of the invention is illustrated in the accompanying drawings, wherein like reference numerals refer to like elements throughout the drawings. Although the drawings are intended to illustrate an embodiment of the present invention, the drawings are not necessarily drawn to scale.

A registration system of the invention may be used with an external drum imaging system that is configured to record digital data onto a printing plate. Although described below with regard to an external drum platesetter, many aspects of the present invention may be used in conjunction with a wide variety of other types of external drum, internal drum, or flatbed imaging systems, including imagesetters and the like, without departing from the intended scope of the present invention.

The imaging system generally includes a front end computer or workstation (not shown) for the design, layout, editing, and/or processing of digital files representing pages to be printed, a raster image processor (RIP) for further processing the digital pages to provide rasterized page data (e.g., rasterized digital files) for driving an image recorder, and an image recorder, such as an external drum platesetter 10, for recording the rasterized digital files onto a printing plate or other recording media. The external drum platesetter 10 records the digital data provided by the RIP onto a supply of photosensitive, radiation sensitive, thermally sensitive, flexographic or other type of suitable printing plate. In the present embodiment, the printing plate is manually loaded onto a staging area of the external drum platesetter 10 by an operator. Alternately, or in addition to manual loading, the printing plate may be provided and loaded onto the external drum platesetter 10 by a media supply or autoloading system, which may accept a plurality of the same size or different size printing plates.

The external drum platesetter 10 includes an external drum 12 having a cylindrical media support surface 14 for supporting the printing plate 16 (shown in FIG. 2) during imaging. The external drum platesetter 10 further includes a scanning system 18, coupled to a movable carriage 20, for recording digital data onto the imaging surface 22 of the printing plate 16 using a single or multiple imaging beams 24 (shown in FIG. 2). The carriage 20 rides along a stable base 26, and the drum 12 rotates about a drum drive system 28. The base 26 may be formed of heavy material, such as a polymer-concrete mixture, granite, or the like, to vibrationally isolate the external drum 12 and scanning system 18 from external vibrations.

Generally, during use a plate is positioned on an input tray 30, and transferred to an imaging station in a direction as indicated at A. After imaging, the plate is transferred from the imaging station to an output tray in a direction as indicated at B using transfer belts 32 that are driven by pulleys 34 about pulley shafts 36. From the output tray, the plate may be exited from the platesetter 10 in either of a direction as indicated at C or a direction as indicated at D by rollers 41 that contact the plate after the pulleys 34 and belts 32 are lowered with respect to the rollers 41.

Figure 2:
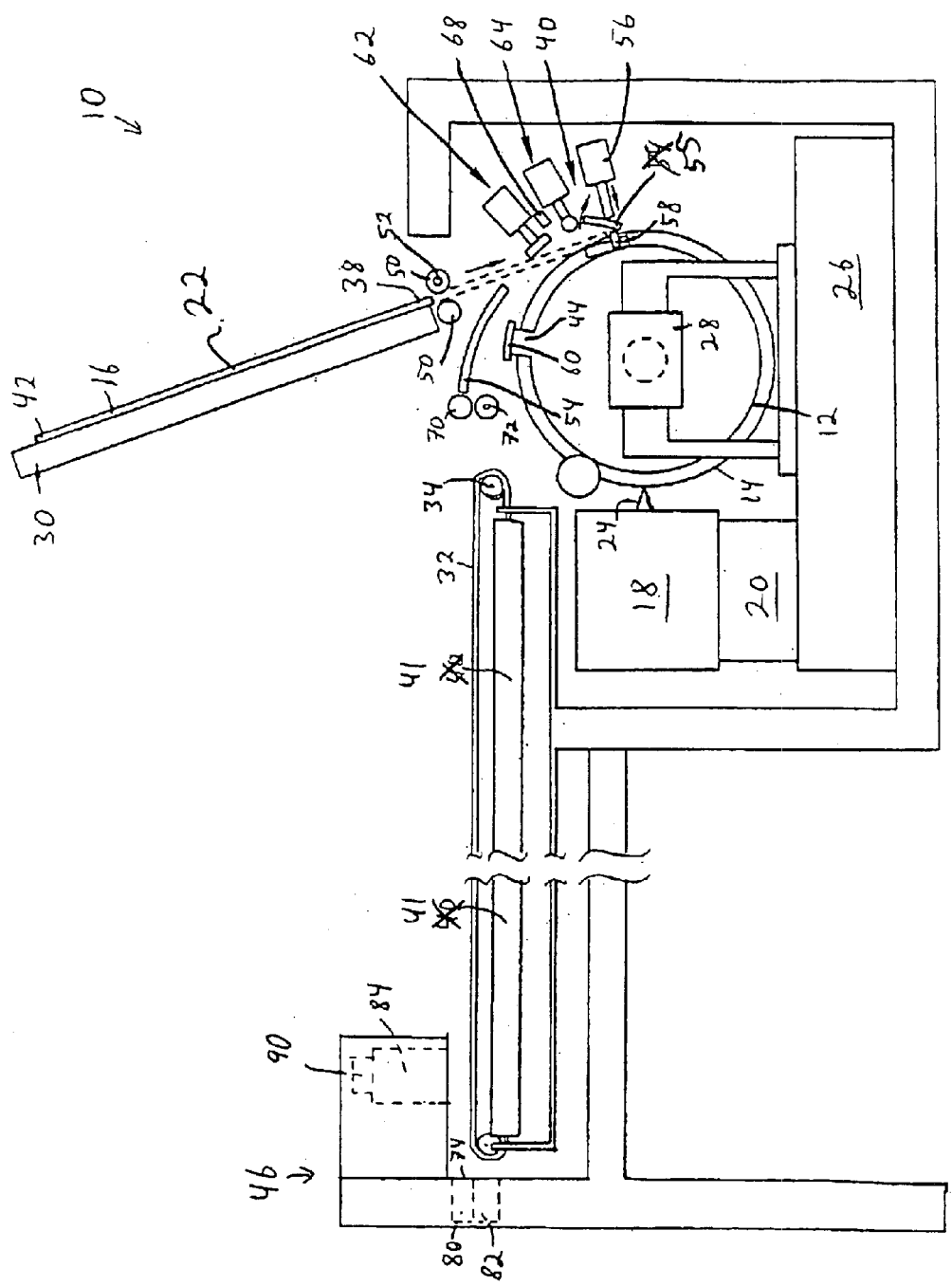
FIG. 2 shows an illustrative side view of the imaging system of FIG. 1 with the housing removed.

As shown in FIG. 2, the scanning system 18 is displaced by the movable carriage 20 in a slow scan (axial) direction along the length of the rotating external drum 12 to expose the printing plate 16 in a line-wise manner when a single beam is used or in a section-wise manner for multiple beams. Other types of imaging systems may also be used in the present invention. In an embodiment, the printing plate 16 is loaded onto the external, drum 12 while rotating the drum in a first clockwise direction. The external drum 12 is then rotated by a drive system 28 in a clockwise or counterclockwise fast scan direction, typically at a rate of about 100–1000 rpm. The printing plate 16 is then imaged while the drum is rotated in the fast scan direction. Finally, the printing plate 16 is unloaded from the external drum 12 while rotating the drum in a second direction.

In accordance with the embodiment of the invention shown in FIG. 1, the system also includes a first registration unit 46 and a second registration unit 48. As will be discussed in further detail below, each registration unit is capable of gripping and moving a plate within a relatively small range of movement, locating a specific optical target, and punching a hole in the plate at a specific location. In other embodiments, the camera could move to locate the optical target. The system would then move either the plate or the registration unit so that they are mutually aligned. In further embodiments, the system may register the position of a plate with respect to an edge of the plate itself rather than by using an optical target.

As shown in FIG. 2, a plate 16 is positioned on the input tray 30 above a pair of resilient input nip rollers 50, one of which may be driven by a drive assembly 52. The leading edge 38 of the plate 16 is positioned by the input tray 30 to rest substantially between the input nip rollers 50. The rollers 50 are positioned above the external drum 12, and are oriented such that the common tangent of the rollers 50 is tangent to the media support surface 14. The input tray 30 is oriented such that the loading path of the plate 16 extends along a line that is tangent to the external drum 12 at a leading edge clamping mechanism 40.

A curved input/output guide platen 54, mounted to a frame member (not shown) of the external drum platesetter 10 may be provided to direct the leading edge 38 of the printing plate 16 toward the leading edge clamping mechanism 40 during the loading of the printing plate 16 onto the external drum 12. In addition, the curved input/output guide platen 54 is configured to direct the printing plate 16 off of the external drum 12 toward the plate output area after imaging is complete.

During loading of a plate 16, the drum 12 is rotated until the leading edge clamping mechanism 40 is positioned to receive the leading edge 38 of the plate 16. A clamping portion 55 of the clamping mechanism 40 is held in an open position by an actuator 56, exposing registration pins 58. A trailing edge clamping mechanism 44 is rotated by the drive system 28, if necessary, to position a clamping bar 60 out of the way of the loading path of the plate 16. An actuation system 62 for the trailing edge clamping mechanism 44, and an ironing roller system 64, may also be refracted away from the media support surface 14 of the external drum 12 out of the way of the loading path. After the leading edge 38 of the plate 16 is properly positioned against the registration pins 58, the leading edge clamping mechanism is closed, thereby pinching the plate 16 against the external drum 12 while the leading edge 38 remains in contact with the registration pins 58.

After the leading edge clamping operation, the external drum 12 is rotated a few degrees by the drive system 28. The ironing roller assembly of the stationary ironing roller system 64 is then extended and positioned against the plate 16 by an actuating system. The plate is drawn around the drum 12 until the trailing edge 42 of the plate 16 is positioned adjacent the trailing edge clamping mechanism 44. The clamping bar 60 is then positioned over the trailing edge 42 of the plate 16. If the size of the plate is not known and pre-programmed into the system, a sensor 68 may be used to detect the trailing edge of the plate 16. The drum and clamping bar 60 are then rotated together, and the clamping bar 60, which is normally biased away from the drum 12, is then forced against the drum 12 by the actuation system 62. Vacuum may also be used to facilitate securing the plate to the drum.

During imaging, the leading edge 38 of the plate 16 is held in position against the media support surface 14 by the leading edge clamping mechanism 40. Similarly, the trailing edge 42 of the printing plate 16 is held in position against the media support surface 14 by the trailing edge clamping mechanism 44. Both the trailing edge clamping mechanism 44 and the leading edge clamping mechanism 40 provide a tangential friction force between the printing plate 16 and the external drum 12 sufficient to resist the tendency of the edges of the printing plate 16 to pull out of the clamping mechanisms 40, 44, at a high drum rotational speed. In accordance with the present invention, only a small section (e.g., 6 mm) of the leading and trailing edges 38, 42, is held against the external drum 12 by the leading and trailing edge clamping mechanisms 40, 44, thereby preserving as much of the available imaging area of the printing plate 16 as possible.

During output of the plate 16 from the drum 12, the drive system 28 rotates the drum 12 in a counterclockwise direction, the trailing edge clamping mechanism 44 is released, and the leading edge clamping mechanism 40 is released. The trailing edge 42 of the plate 16 is guided by the input/output platen 54 toward resilient output nip rollers 70, one of which may include a drive system 72. The plate 16 is then received in the output area by the belts 32 which are rotated about pulleys 34 in a direction that causes the top surface of the belts 32 to travel with the plate as it emerges from the imaging area, and thereby carry the plate away from the imaging area.

Once the plate reaches a stop surface that may be associated with each registration unit 46 and 48, the plate stops moving and the drive system for the pulleys 34 is turned off. For example, registration unit 46 may include a stop surface 74 as shown in FIG. 2. In other embodiments, plate advancement may cease responsive to the output of a position sensor.

Figure 3:
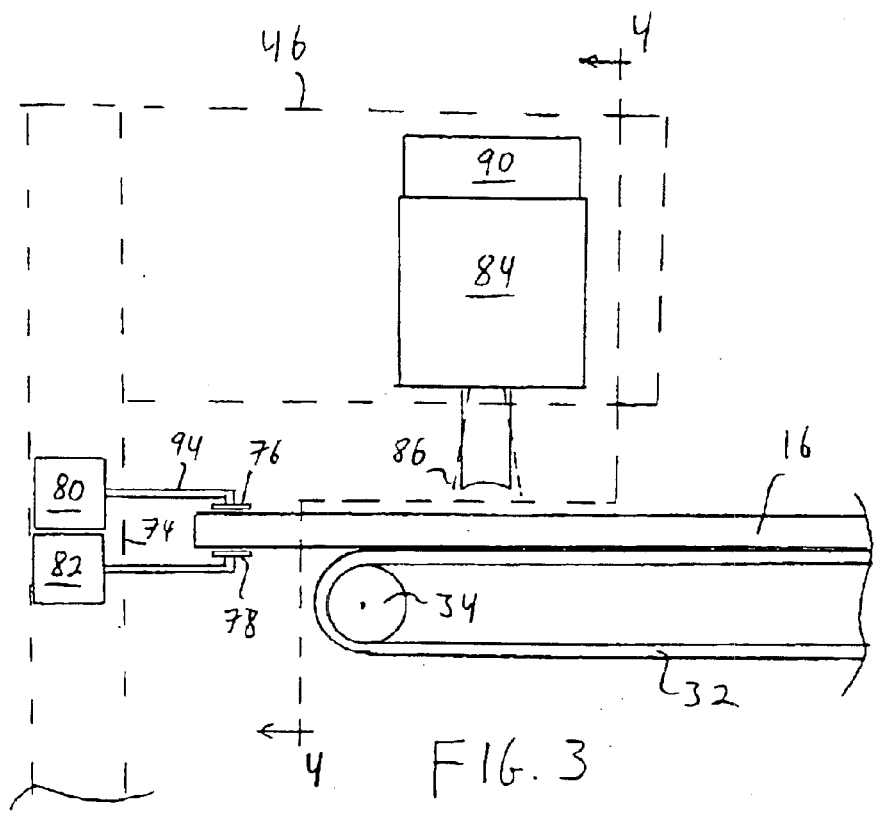
FIG. 3 shows an illustrative side view of a punch assembly in the system of FIG. 1 with the punch assembly housing removed.

As shown in FIG. 3, gripper portions 76 and 78 of positioning units 80 and 82 may then extend out from the registration unit 46 and grip either side of the plate 16. An image detection unit 84 then looks for a target image on the plate, and in the present embodiment, the target image is printed on the plate 16 during imaging as discussed above.

Figure 4:
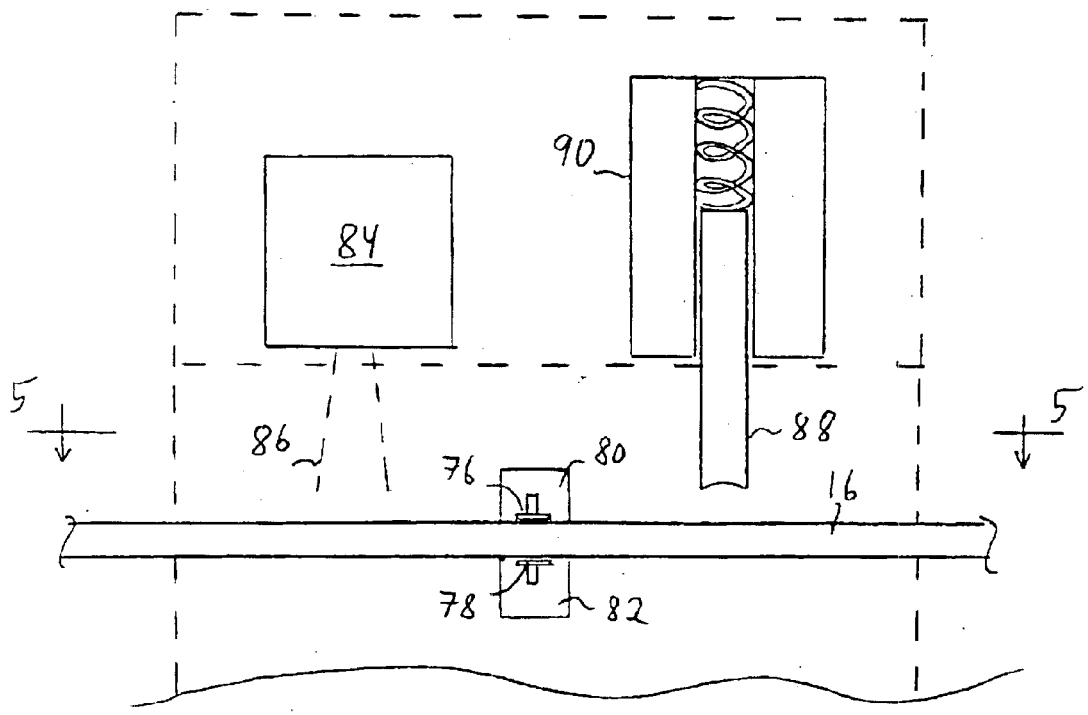
FIG. 4 shows an illustrative cross-sectional view of the punch assembly of FIG. 3 taken along line 4—4 thereof.
Figure 5:
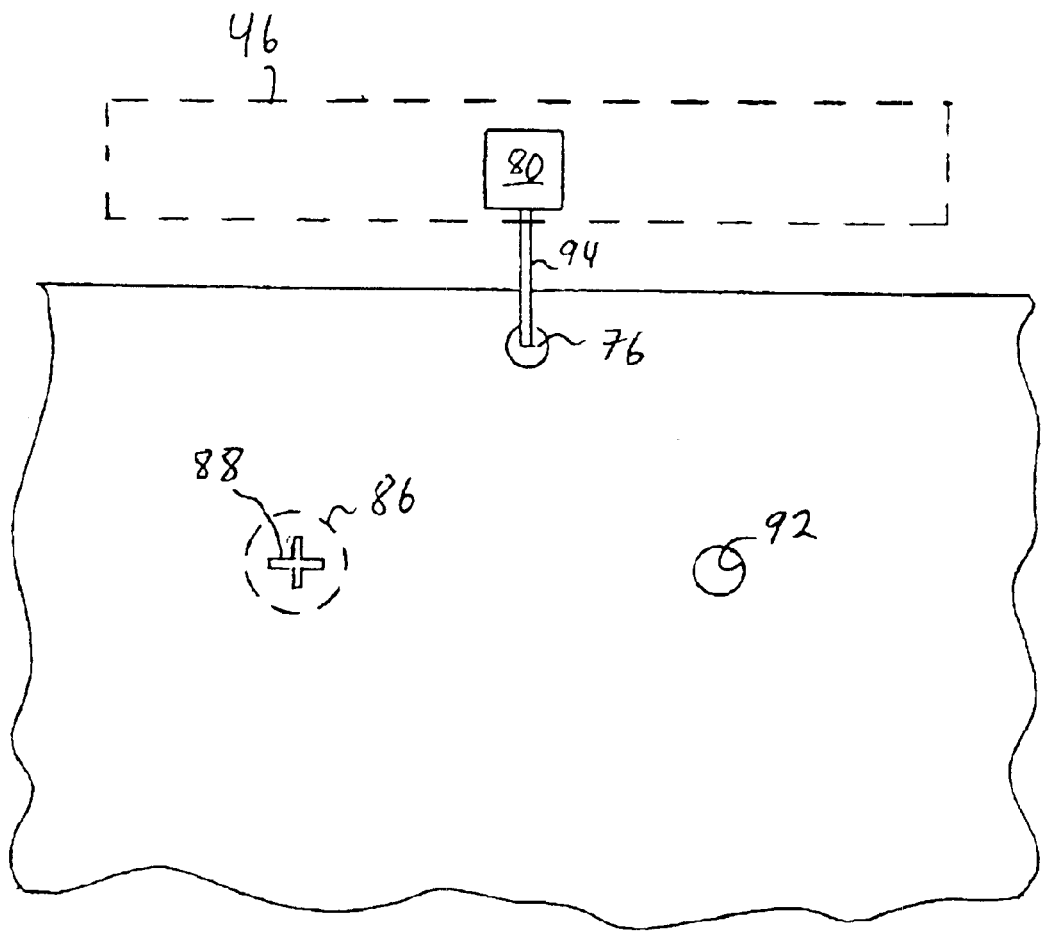
FIG. 5 shows an illustrative top view of the punch assembly and plate of FIG. 4 taken along line 5—5 thereof.

The image detection unit 84 includes a CCD camera that records the image in its present field of view 86 as shown in FIGS. 4 and 5. The system searches for a target image 88 in the recorded field, and adjusts the positioning units 80 and 82 until the target image is centered within the field of view 86 of the image detection unit 84. Once the target image is centered within the field of view 86 of the image detection unit 84, a punch 88 is actuated by a punch unit 90, which may for example include a spring biased solenoid punch actuator. The punch causes a registration hole 92 to be created in the plate 16 at the desired location. The punch 88 is preferably positioned between belts 32.

Figure 6:
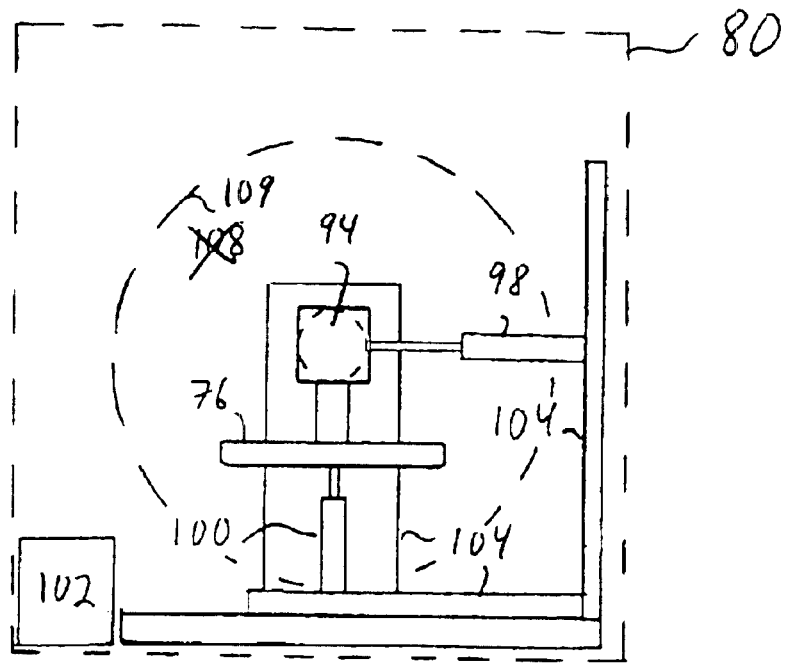
FIG. 6 shows an illustrative front view of a positioning unit with the housing removed.
Figure 7:
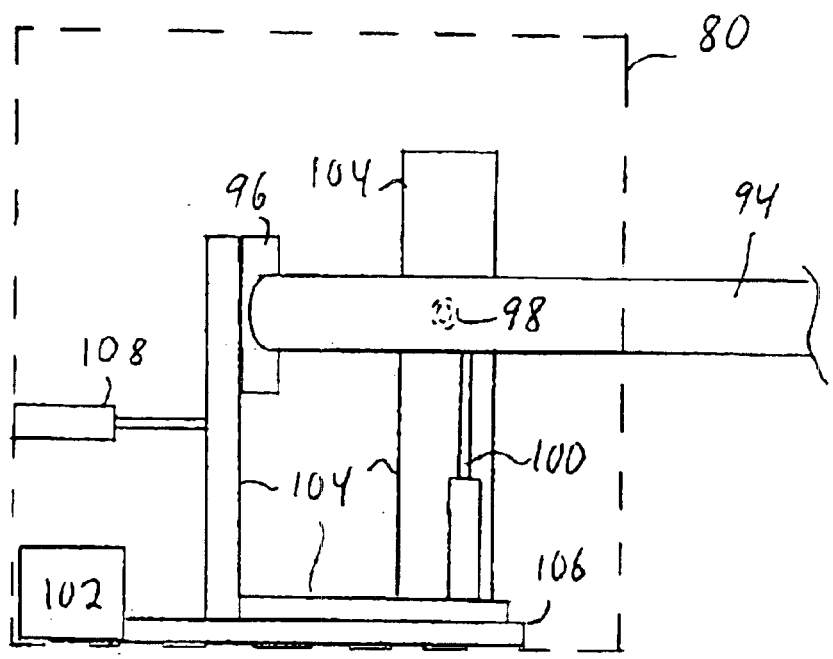
FIG. 7 shows an illustrative side view of the positioning unit of FIG. 6.

As shown in FIGS. 6 and 7, the positioning unit 80 includes a gripper 76 that is mounted on an arm 94, and the arm 94 is pivotally coupled to the unit 80 via a universal joint 96. The positioning unit 80 also includes first axis pneumatic actuator 98 and a second axis pneumatic actuator 100 that are each coupled to a positioning unit controller 102. The pneumatic actuators 98 and 100 cooperate to provide full movement of the arm 94 and gripper 76 in two degrees of freedom though an opening 109 in the unit 80. Each of the actuators 98 and 100 is mounted on a carriage 104, which moves with respect to a track 106. The universal joint 96 is mounted to the carriage 104, and the carriage 104 is movably actuated by a third axis pneumatic actuator 108 to provide a third degree of freedom of movement of the gripper 76 responsive to the controller 102.

The registration unit 46, therefore, provides three degrees of freedom of movement of the gripper 76 to properly position the target 88 within the field of view of the image detection unit 84. The registration unit 48 shown in FIG. 1 similarly provides three degrees of freedom of movement of a gripper to position a second target within the field of view of another image detection unit so that another registration hole may be punched in the plate. In further embodiments, any number of registration units may be used, and may be positioned anywhere within the output area of the imaging system.

After registration, the grippers 76 and 78 are lifted away and withdrawn from the plate 16, and the rack of pulleys 34 and belts 32 is lowered with respect to the rack of rollers 40 as shown in FIGS. 1 and 2. The plate 16 then rests on the rollers 40, and may be exited from the platesetter in either direction as indicated at C or D. In various embodiments, a chemical processing station may be positioned adjacent the imagesetter 10 so that the plate is output directly to the processing station.

Those skilled in the art will appreciate that numerous further modifications and variations maybe made to the above disclosed embodiments without departing from the spirit and scope of the present invention.

What is claimed is:

1. A pre-press imaging system for imaging and registering recordable media, said imaging system comprising:
   an external drum imaging system for imaging recordable media and producing imaged media including an imaged target area;
   a primary transfer assembly by which imaged media may be moved to an output surface of an output station;
   an image detection unit for receiving optical image data representative of a portion of said imaged media and for outputting image detection data;
   a positioning unit for adjusting the position of said imaged media with respect to said primary transfer assembly responsive to said image detection data; and
   a punch unit for punching a registration feature in said imaged media.

2. A pre-press imaging system as claimed in claim 1, wherein said system includes a pair of image detection units, a pair of positioning units, and a pair of punch units.

3. A pre-press imaging system as claimed in claim 2, wherein said pair of positioning units are located at one end of said output surface that is opposite said external drum imaging system.

4. An imaging system for imaging and registering recordable media, said imaging system comprising:
   input means for receiving recordable media in said imaging system;
   imaging means for imaging said recordable media and for providing imaged media;
   registration means for receiving imaged media, for registering said imaged media, and for providing registered imaged media, said registration means including a position detection unit for viewing a target image on the imaged media and a positioning assembly for adjusting the position of said registered imaged media with respect to a primary transfer assembly by which said imaged media may be provided to said registration means responsive to an output of said position detection unit; and
   output means for providing that said registered imaged media may exit said imaging system.

5. An imaging system as claimed in claim 4, wherein said registration means includes punching means for punching a hole in said imaged media.

6. A method of imaging and registering recordable media in an imaging system, said method comprising the steps of:
   receiving recordable media via an input opening in said imaging system;
   imaging said recordable media to provide imaged media, said imaged media including a target image;
   detecting a position of said target image;
   positioning said imaged media within said imaging system with respect to a primary transfer assembly by which the imaged media is transferred to a registration unit;
   registering imaged media in the registration unit to provide registered imaged media responsive to the position of said target image; and outputting the registered imaged media from said imaging system.

7. A method as claimed in claim 6, wherein said detecting step further includes optically detecting the position of said target image on said imaged media.

8. A method as claimed in claim 6, wherein said step of registering said imaged media further includes the step of applying a registration feature to said imaged media.

* * * * *